US009535149B2

(12) United States Patent
Paul

(10) Patent No.: US 9,535,149 B2
(45) Date of Patent: Jan. 3, 2017

(54) METHOD AND APPARATUS FOR ACQUISITION OF MAGNETIC RESONANCE DATA

(71) Applicant: Dominik Paul, Bubenreuth (DE)

(72) Inventor: Dominik Paul, Bubenreuth (DE)

(73) Assignee: Siemens Aktiengesellschaft, Munich (DE)

( * ) Notice: Subject to any disclaimer, the term of this patent is extended or adjusted under 35 U.S.C. 154(b) by 614 days.

(21) Appl. No.: 13/956,576

(22) Filed: Aug. 1, 2013

(65) Prior Publication Data

US 2014/0035579 A1 Feb. 6, 2014

(30) Foreign Application Priority Data

Aug. 1, 2012 (DE) .................. 10 2012 213 549

(51) Int. Cl.
*G01R 33/58* (2006.01)
*G01R 33/561* (2006.01)

(52) U.S. Cl.
CPC ........... *G01R 33/583* (2013.01); *G01R 33/561* (2013.01); *G01R 33/5617* (2013.01)

(58) Field of Classification Search
CPC .. G01R 33/583; G01R 33/561; G01R 33/5617
See application file for complete search history.

(56) References Cited

U.S. PATENT DOCUMENTS

| 4,875,012 | A | 10/1989 | Maeda et al. |
| 5,222,390 | A * | 6/1993 | Monrabal ............ G01N 25/147 73/61.76 |
| 5,459,401 | A | 10/1995 | Kiefer |
| 6,411,089 | B1 | 6/2002 | Anand et al. |
| 7,592,808 | B1 | 9/2009 | King |
| 2009/0182222 | A1* | 7/2009 | Machida ............. G01R 33/482 600/410 |
| 2010/0160767 | A1* | 6/2010 | Deimling .......... G01R 33/5613 600/419 |
| 2013/0099785 | A1 | 4/2013 | Li et al. |

* cited by examiner

*Primary Examiner* — Gregory H Curran
(74) *Attorney, Agent, or Firm* — Schiff Hardin LLP

(57) ABSTRACT

In a method and magnetic resonance system for the acquisition of magnetic resonance data in a selected region of an examination subject, magnetic resonance data are acquired more than once using a magnetic resonance system, magnetic resonance data are acquired more than once from a selected partial region the portion of k-space filled with data corresponding to the selected region of the subject, and the multiply acquired magnetic resonance data are processed into a data set, the aforementioned partial region is selected so as to be located decentrally in k-space, meaning that it is asymmetrical relative to the center of k-space.

13 Claims, 5 Drawing Sheets

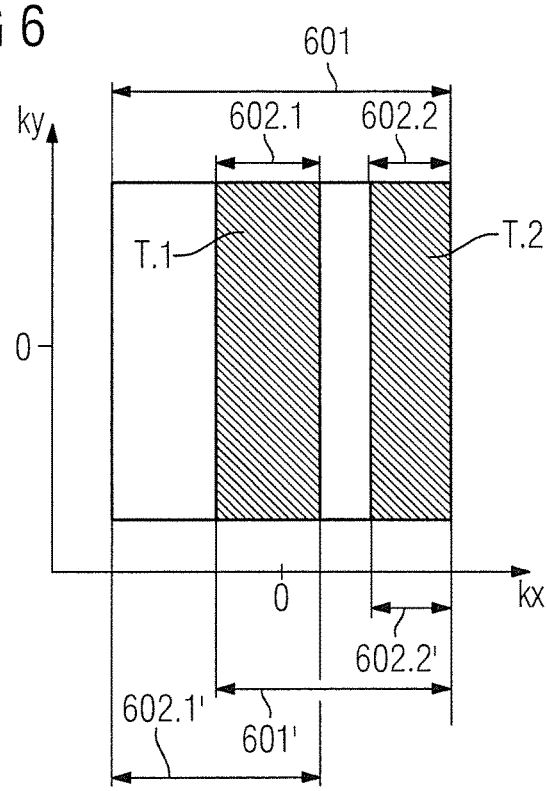
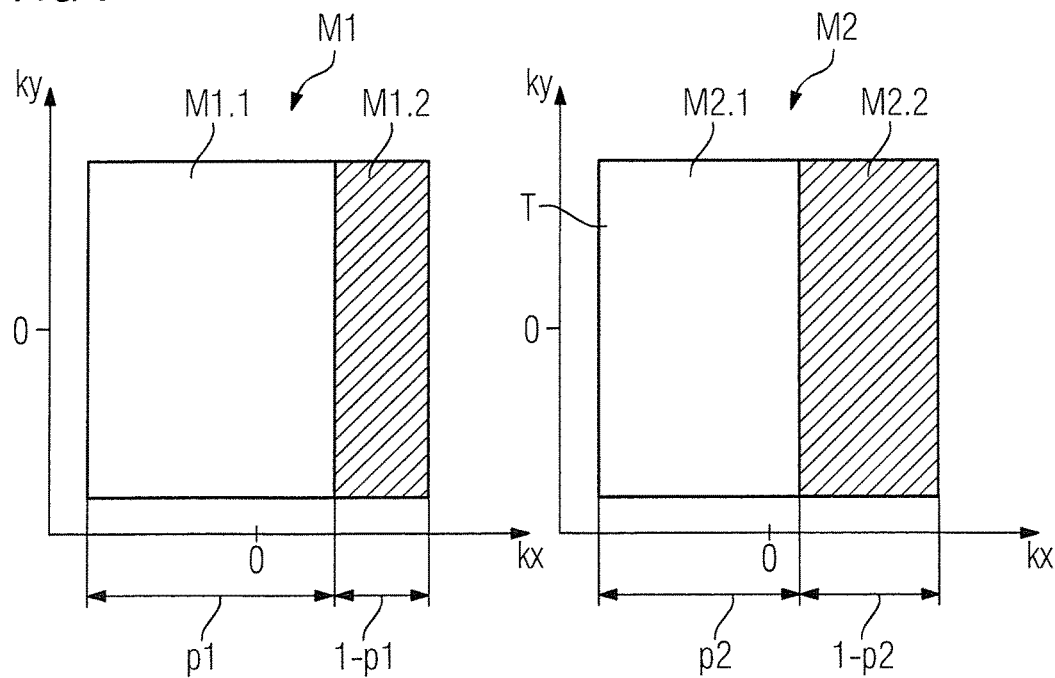

METHOD AND APPARATUS FOR ACQUISITION OF MAGNETIC RESONANCE DATA

BACKGROUND OF THE INVENTION

Field of the Invention

The present invention concerns a method to acquire magnetic resonance data, as well as a magnetic resonance system, and an electronically readable data storage medium.

Description of the Prior Art

Magnetic resonance MR is a known modality with which images of the inside of an examination subject can be generated. Expressed in a simplified manner, for this purpose the examination subject in a tunnel opening of a magnetic resonance apparatus is positioned in a strong, static, homogeneous basic magnetic field (also called a $B_0$ field) with a field strength of 0.2 to 7 Tesla or more, such that nuclear spins in the subject orient along the basic magnetic field. Radio-frequency (RF) excitation pulses and possible refocusing pulses are radiated into the examination subject to trigger magnetic resonance signals, which are detected and entered as data values into an electronic memory, in an organized manner that represents a domain known as k-space, such as a matrix. On the basis of the k-space data, MR images are reconstructed or spectroscopy data are determined. Rapidly switched (activated) magnetic gradient fields are superimposed on the basic magnetic field for spatial coding of the magnetic resonance data (measurement data). The acquired measurement data are digitized and stored as complex numerical values in k-space matrix. For example, by means of a multidimensional Fourier transformation, an associated MR image can be reconstructed from the k-space matrix populated with values.

Artifacts can occur in the acquisition of magnetic resonance data for imaging, particularly in the acquisition of data from the examination subject in planes that proceed essentially orthogonally to the middle axis of the tunnel opening, for the purpose of generating a cross-sectional image.

Such artifacts have previously been avoided by the entirety of k-space corresponding to the subject to be imaged being scanned (filled with data) repeatedly, and the magnetic resonance data that are thus obtained have been averaged. However, this leads to an increase of the total measurement time by up to 40%, which is unacceptable in an everyday clinical environment.

SUMMARY OF THE INVENTION

An object of the present invention is to provide a method to acquire magnetic resonance data, and a magnetic resonance system and an electronically readable data medium that avoid or at least reduce the cited artifacts.

The invention is based on the following insight:

The aforementioned artifacts arise particularly when the examination subject extends into the edge regions of the tunnel opening of the magnetic resonance system. The gradient fields strongly decrease in these edge regions. This can result in signals from these regions are no longer being correctly spatially coded. For example, this can occur in sagittal acquisitions of the lumbar spinal column, when signals of the arms positioned in the edge regions are incorrectly allocated to the image data of the lumbar spinal column to be imaged. If no portions of the examination subject to be examined are located in the edge regions, the artifacts do not occur. The larger the diameter of the tunnel opening of the magnetic resonance system, the more severe the problem.

In a method according to the invention for the acquisition of magnetic resonance data in a selected region of an examination subject, magnetic resonance data are acquired more than once using a magnetic resonance system, magnetic resonance data are acquired more than once from a selected partial region the portion of k-space filled with data corresponding to the selected region of the subject, and the multiply acquired magnetic resonance data are processed into a data set, the aforementioned partial region is selected so as to be located decentrally in k-space, meaning that it is asymmetrical relative to the center of k-space.

Because magnetic resonance data are acquired multiple times only in a partial region of k-space corresponding to the selected region—meaning that k-space is scanned multiple times in this partial region—the measurement time does not increase to the same drastic degree as has previously been the case in the prior art. The decentralized arrangement of the repeatedly scanned partial region in k-space corresponding to the selected region causes artifacts due to the parts of the examination subject that are located in the edge regions of the tunnel opening of the magnetic resonance system to already be strongly reduced. A double measurement of the partial region—i.e. a double acquisition of the magnetic resonance data from the partial region—is already sufficient.

In one embodiment, the magnetic resonance data are acquired using a three-dimensional turbo spin echo sequence (TSE sequence), also called an FSE sequence (Fast Spin Echo). Such sequences, which read out multiple k-space lines after an excitation pulse, are particularly well suited for fast acquisition of three-dimensional volumes.

In one exemplary embodiment, the readout module of the pulse sequence corresponds to a SPACE sequence ("Sampling Perfection with Application optimized Contrasts using different flip angle Evolutions"), which has proven to have advantage compared to the older TSE and FSE sequences, due to the variable flip angles and the long echo train lengths that are possible with a SPACE sequence. SPACE allows high-resolution, three-dimensional (3D) image exposures to be created in an even shorter period of time than older TSE sequences. The SPACE sequence is a single slab 3D turbo spin echo (TSE) sequence with application-specific variable flip angles.

A magnetic resonance system according to the invention for the acquisition of magnetic resonance data in a selected region within an examination subject has a basic field magnet, a gradient field system, at least one RF antenna, and a control device to operate the gradient field system and the at least one RF antenna, to receive the measurement signals acquired by the at least one RF antenna, and to evaluate the measurement signals and to create the magnetic resonance data. The system has a computer to determine the center frequency of the refocusing pulses and to determine flip angles adapted from a predetermined signal curve. The magnetic resonance system is designed to acquire magnetic resonance data from k-space corresponding to the selected region, such that magnetic resonance data are acquired more than once from a selected partial region the portion of k-space filled with data corresponding to the selected region of the subject, and the multiply acquired magnetic resonance data are processed into a data set, the aforementioned partial region is selected so as to be located decentrally in k-space, meaning that it is asymmetrical relative to the center of k-space.

In particular, the magnetic resonance system is designed to implement the method according to the invention as described herein.

An electronically readable data storage medium according to the invention has electronically readable control information stored thereon with the control information being designed to cause a magnetic resonance system to implement the method according to the invention as described herein given use of the data medium in a control device of a magnetic resonance system.

The advantages and embodiments specified with regard to the method analogously apply to the magnetic resonance system and the electronically readable data medium.

BRIEF DESCRIPTION OF THE DRAWINGS

FIG. 6 is a schematic representation of a further exemplary embodiment of an arrangement according to the invention of a partial region to be measured multiple times in k-space corresponding to the selected region.

FIG. 7 is a schematic representation of an exemplary embodiment of an arrangement according to the invention of a partial region to be measured multiple times in k-space corresponding to the selected region, in combination with a known supplementary method.

DESCRIPTION OF THE PREFERRED EMBODIMENTS

Figure 1:
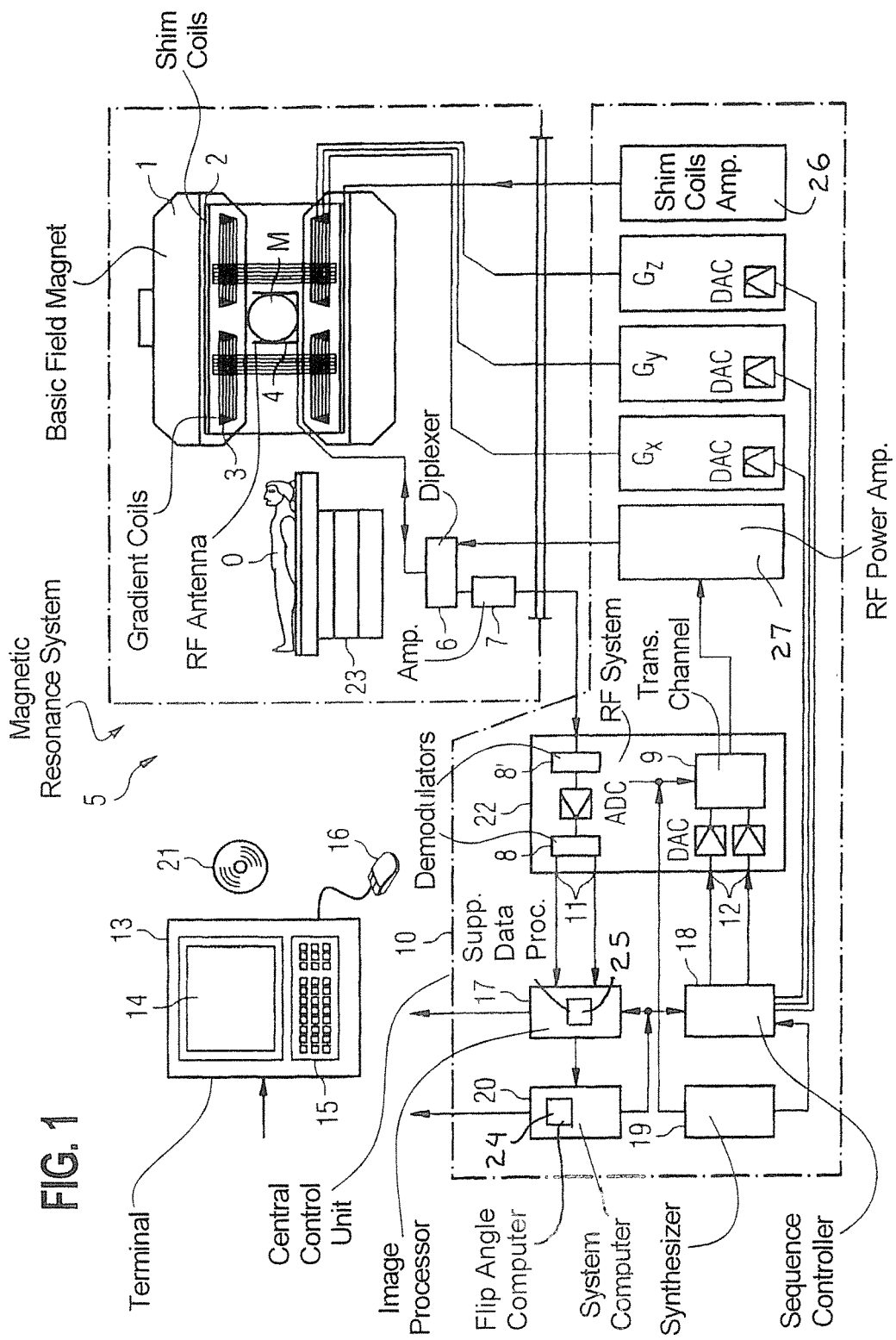
FIG. 1 schematically illustrates a magnetic resonance system according to the invention.

FIG. 1 shows a schematic representation of a magnetic resonance system 5 (a magnetic resonance imaging or magnetic resonance tomography apparatus). A basic field magnet 1 generates a temporally constant, strong magnetic field for polarization or alignment of the nuclear spins in a selected region O of an examination subject U, for example of a part of a human body that is to be examined. The subject U lies on a table 23 and is examined in the magnetic resonance system 5. The high homogeneity of the basic magnetic field that is required for the magnetic resonance measurement is defined in a typically (but not necessarily) spherical measurement volume M into which the parts of the human body that are to be examined are introduced. Shim plates made of ferromagnetic material are attached at suitable points to assist the homogeneity requirements, and in particular to eliminate temporally invariable influences. Temporally variable influences are eliminated by shim coils 2, operated by shim coils amplifier 26.

A cylindrical gradient coil system 3 composed of three sub-windings is used in the basic field magnet 1. Each sub-winding is supplied with current by an amplifier to generate, for example, a linear (also temporally variable) gradient field in the respective direction of the Cartesian coordinate system. The first sub-winding of the gradient field system 3 generates a gradient $G_x$ in the x-direction; the second sub-winding generates a gradient $G_y$ in the y-direction; and the third sub-winding generates a gradient $G_z$ in the z-direction. Each amplifier has a digital/analog converter that is activated by a sequence controller 18 for accurately-timed generation of gradient pulses.

Located within the gradient field system 3 are one (or more) radio-frequency antennas 4—in particular at least one multichannel RF transmission coil and at least one RF reception coil—that convert the radio-frequency pulses emitted by a radio-frequency power amplifier 27 into an alternating magnetic field for excitation of the nuclei and alignment of the nuclear spins of the examination subject U to be examined, or of the region of the selected region O of the examination subject U that is to be examined. Each radio-frequency antenna 4 is composed of one or more RF transmission coils and multiple RF reception coils in the form of an annular—preferably linear or matrix-like—arrangement of component coils. The alternating field emanating from the precessing nuclear spins—i.e. normally the spin echo signals caused by a pulse sequence composed of one or more radio-frequency pulses and one or more gradient pulses—is also converted by the RF reception coils of the respective radio-frequency antenna 4 into a voltage (measurement signal). This signal is supplied via an amplifier 7 to a radio-frequency reception channel 8 of a radio-frequency system 22. The radio-frequency system 22 furthermore has a transmission channel 9 in which the radio-frequency pulses are generated for the excitation of the magnetic resonance. The respective radio-frequency pulses are digitally represented in the sequence controller 18 as a series of complex numbers based on a pulse sequence predetermined by the system computer 20, that has a processor 24 to determine flip angles adapted from a predetermined signal curve. This number sequence is supplied as a real part and an imaginary part to a digital/analog converter in the radio-frequency system 22 via respective inputs 12, and from the digital/analog converter to the transmission channel 9. In the transmission channel 9, the pulse sequences are modulated on a radio-frequency carrier signal whose base frequency corresponds to the center frequency.

The switching from transmission operation to reception operation takes place via a transmission/reception diplexer 6. The RF transmission coils of the radio-frequency antenna(s) 4 radiate(s) the radio-frequency pulses for excitation of the nuclear spins into the measurement volume M, and resulting echo signals are scanned via the RF reception coil(s). The correspondingly acquired nuclear magnetic resonance signals are phase-sensitively demodulated to an intermediate frequency in a reception channel 8' (first demodulator) of the radio-frequency system 22 and digitized in an analog/digital converter (ADC). This signal is further demodulated to a frequency of 0. The demodulation to a frequency of 0 and the separation into real part and imaginary part occur in a second demodulator 8 after the digitization in the digital domain. A planar or three-dimensional MR image data set can be reconstructed by an image computer 17 from the measurement data acquired in such a manner. The image computer in particular has a processor 25 with which magnetic resonance data that may not have been acquired can be supplemented by means of known methods (such as half Fourier or partial Fourier methods) and/or magnetic resonance data that are acquired multiple times can be processed into a data set. The administration of the measured magnetic resonance data, the image data and the control programs takes place via the system computer 20. Based on a specification with control programs, the sequence controller 18 monitors the generation of the respective desired pulse sequences and the corresponding scanning of k-space. In particular, the sequence controller 18 controls the accurately-timed switching of the gradients, the emission of the radio-frequency pulses with defined phase amplitude and the reception of the nuclear magnetic resonance signals.

The time base for the radio-frequency system 22 and the sequence controller 18 is provided by a synthesizer 19. The selection of appropriate control programs to generate an acquisition of magnetic resonance data (which programs are stored on a DVD 21, for example), the selection of a selected region O that should be excited and from which magnetic resonance data should be received, the specification of a substance with which the selected region O is filled to determine the flip angles for the desired signal curve, and the presentation of a generated MR image take place via a terminal 13. The terminal 13 may have a keyboard 15, a mouse 16 and a monitor 14 with which the selected region can be entered, and with which a partial region of k-space that corresponds to the selected region—which partial region is to be measured multiple times—and possible percentiles for a partial Fourier method that are to be applied, can be selected.

Figure 2:
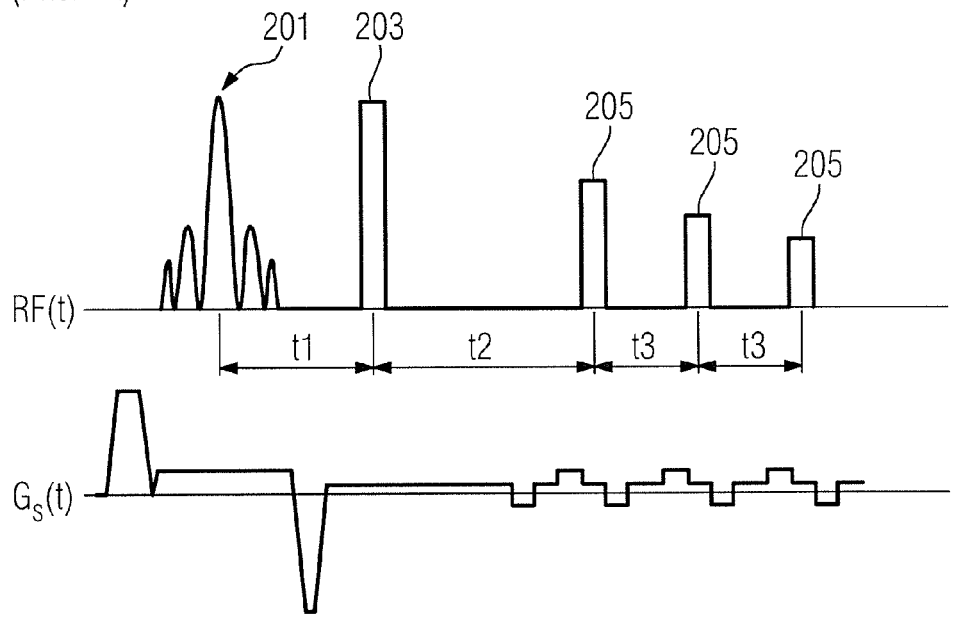
FIG. 2 shows an example of a pulse sequence that can be used for the method according to the invention.

FIG. 2 shows an example of a pulse sequence scheme as it can be used for the method according to the invention.

The radio-frequency pulses to be radiated are presented in the upper line (RF(t)). After the excitation pulse 201—for example a 90° pulse (meaning that it generates a flip angle of approximately 90°)—a first refocusing pulse 203 is radiated after a first time period t1. After a second time period t2 after the first refocusing pulse 203, a first additional refocusing pulse 203 (of a series of at least two additional refocusing pulses 205 which have the time interval t3 among one another) is radiated after a second time period t2. For example, the first refocusing pulse 203 is a 180° pulse, meaning that it generates a flip angle of approximately 180°. The additional refocusing pulses 205 generate variable flip angles adapted to a predetermined signal curve and are non-selective pulses.

The signal curve is dependent on a predetermined substance in the selected region. With the variably adapted flip angles, a predetermined signal strength for the respective refocusing pulse can be achieved at the readout of the magnetic resonance data generated via the refocusing pulse.

The refocusing pulses 205 generate spin echo signals that are read out in a known manner (not shown).

In the lower line, the gradients (Gz(t)) to be switched (activated) before and during the refocusing pulses and the readout are shown as examples.

The pulse sequence that is used can thus in particular be a SPACE sequence as already addressed above.

The following discussion refers to a "first measurement", a "second measurement" and possibly one or more "additional measurements"; the designation of "first", "second" and "additional" do not refer to a chronological order of the acquisitions, but rather are only to enable a differentiation of the measurements that can take place in an arbitrary order.

Figure 3:
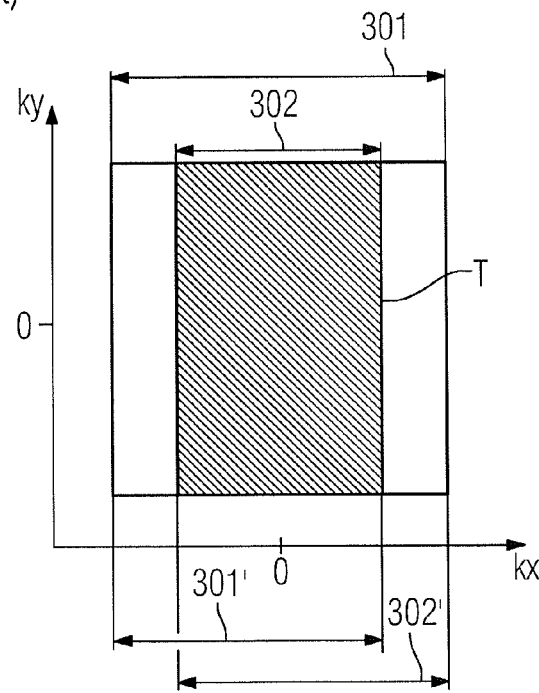
FIG. 3 is a schematic representation of a known arrangement of a partial region to be measured multiple times in k-space corresponding to a selected region of the subject.

A schematic representation of a known arrangement of a partial region T to be measured multiple times (presented with a hatching) in k-space corresponding to the selected region is shown in FIG. 3. In previously used methods in which k-space is scanned (here represented as a rectangle in the kx- and ky-direction, for example) is scanned multiple times in a partial region T, this partial region T is arranged centrally in k-space, i.e. symmetrically relative to the k-space center.

In the shown example, k-space is not completely scanned multiple times (only) in the kx k-space direction. For clarity, in the following examples this mode continues to be maintained, without this being a limitation for further embodiments. In general, additional measurements are conceivable in part in all three spatial directions, and arbitrary combinations of these are analogously conceivable.

In order to acquire the partial region T twice, it is possible to acquire the entirety of k-space (labeled with 301) in a first measurement and to acquire the partial region T (labeled with 302) in a second measurement. Another possibility would be to acquire the region labeled with 301'—for example in an alternative first measurement—and to acquire the region labeled with 302' in an alternative second measurement, which regions 301' and 302' overlap in the partial region T that is to be measured twice.

Figure 4:
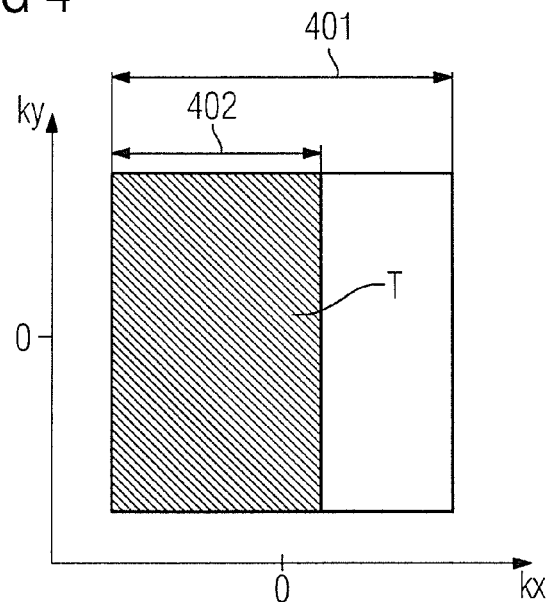
FIG. 4 is a schematic representation of a first exemplary embodiment of an arrangement according to the invention of a partial region to be measured multiple times in k-space corresponding to the selected region.

A schematic representation of a first exemplary embodiment of an arrangement according to the invention of a partial region T (shown with shading) that is to be measured multiple times in k-space corresponding to the selected region is now shown in FIG. 4.

In contrast to FIG. 3, here the partial region T is arranged decentrally in k-space. In the shown example, the partial region T extends from the (left) edge of k-space to beyond the k-space center (kx=0), and thus covers more than half of k-space corresponding to the selected region. The partial region T includes both an edge region of k-space (here the left) corresponding to the selected region (in the addressed artifacts are reduced) and the k-space center of k-space corresponding to the selected region (with the central k-space lines that are important to the contrast are likewise scanned repeatedly), with which artifacts are likewise reduced.

In order to acquire the partial region T twice in this exemplary embodiment, for example, it is possible to acquire the entirety of k-space (labeled with 401) in a first measurement and to acquire the partial region (labeled with 402) in a second measurement.

Figure 5:
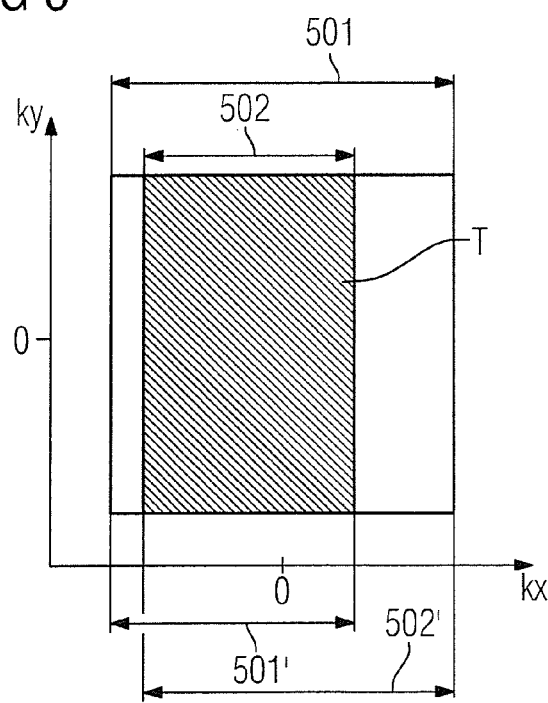
FIG. 5 is a schematic representation of a further exemplary embodiment of an arrangement according to the invention of a partial region to be measured multiple times in k-space corresponding to the selected region.

FIG. 5 shows an additional, schematic representation of an additional exemplary embodiment of an arrangement according to the invention of a partial region T (shown with shading) to be measured multiple times in k-space corresponding to the selected region.

In this example, the partial region T is likewise arranged decentrally in k-space that corresponds to the selected region, but the partial region There does not extend all the way to the edge of k-space. In spite of this, the partial region T extends into the (here left) edge region of k-space and (as in the example of FIG. 4) beyond the k-space center (kx=0). In the example of FIG. 5, the partial region T thereby also comprises both a portion of the edge region of k-space (here the left) corresponding to the selected region (whereby the addressed artifacts are reduced) and the k-space center of k-space corresponding to the selected region (whereby the central k-space lines that are important to the contrast are likewise scanned multiple times), with which artifacts are likewise reduced.

In this example, there are again multiple possibilities to measure the partial region T twice. On the one hand, it is possible to acquire the entirety of k-space (labeled with 501) in a first measurement and to acquire the partial region T (labeled with 502) in a second measurement. Another possibility would be, for example, to acquire the region labeled with 501' in an alternative first measurement and the region labeled with 502' in an alternative second measurement, which regions 501' and 502' overlap in the partial region T that is to be measured twice.

In the examples of FIGS. 4 and 5, the partial region T is thus shifted out of the central position in k-space corresponding to the selected region in a direction in which the partial region is smaller than the entirety of k-space corresponding to the selected region. The shifting is in the direction of the edge of k-space corresponding to the selected region.

An additional schematic representation of a further exemplary embodiment of an arrangement according to the invention of a partial region T (shown shaded) in k-space corresponding to the selected region is indicated in FIG. 6.

Here the partial region T that is to be measured multiple times is divided into two sub-partial regions T.1 and T.2. As was already stated with regard to the examples of FIGS. 4 and 5, to avoid artifacts it is advantageous if the k-space center determining the contrast is measured multiple times, for which the partial region T—here in sub-region T.1—covers a portion of k-space that includes the k-space center. In any case, the partial region T—at least in a sub-partial region T.2—covers a portion of an edge region (here the right) of k-space corresponding to the selected region in order to acquire magnetic resonance data which reduce the unwanted artifacts.

In order to acquire the partial region T twice in this exemplary embodiment, for example, it is possible to acquire the entirety of k-space (labeled with 601) in a first measurement and to acquire the sub-partial regions T.1 and T.2 (labeled with 602.1 and 602.2), which together yield the partial region T, in a second (and possibly third) measurement.

Another possibility would be, for example, to acquire the region labeled with 601' in an alternative first measurement and to acquire the regions labeled with 602.1' and 602.2' in an alternative second measurement (and possibly in an alternative third measurement), which regions 602.1' and 602.2' overlap in the partial region T that is to be measured twice here, for example.

FIGS. 4 through 6 shows examples of arrangements of a partial region T that is to be measured multiple times. Additional arrangements in which (for example) the sub-partial region T.1 from FIG. 6 is itself already arranged decentrally but still includes the k-space center kx=0, and/or in which the sub-partial region T.2 does not extend to the outermost edge of k-space, but rather is shifted somewhat in the direction of the k-space center kx=0, are analogously conceivable.

In general, the following applies to all embodiments: The larger the region of k-space corresponding to the selected region that is covered by the partial region, the better that artifacts can be avoided, and the better the signal-to-noise ratio (SNR) as well, but also the longer the duration of the measurement overall since more magnetic resonance data must be measured. For example, the partial region should cover at least 40 percent of k-space corresponding to the selected region. In one exemplary embodiment, the partial region covers at least 50 percent of k-space corresponding to the selected region. In the shown examples the first measurement and the second measurement always cover different areas of k-space, that only overlap in the partial region T. This way the partial region T can be chosen smaller than in other known methods such as the already mentioned half Fourier or partial Fourier methods while still yielding high quality images.

FIG. 7 shows a schematic representation of an exemplary embodiment of an arrangement according to the invention of a partial region T to be measured repeatedly in k-space corresponding to the selected region, in combination with a known supplementation method. Not all magnetic resonance data of k-space can thus be measured; rather, unmeasured magnetic resonance data from k-space corresponding to the selected region are also supplemented by means of a known supplementation method.

In contrast to FIGS. 3 through 7, in the representation of FIG. 7 the two measurements M1 and M2 that are to be implemented are depicted next to one another in order to clarify the combination with a known supplementation method (for example a partial Fourier method—in particular a half-Fourier method—in connection with a zero filling algorithm, or a Magosian reconstruction algorithm, or a homodyne reconstruction algorithm, or a POCS reconstruction algorithm) in which unacquired magnetic resonance data are supplemented by the supplementation method.

According to the example shown in FIG. 7, k-space is measured in a first measurement M1 only up to a first percentage p1, meaning that only the region M1.1 of k-space corresponding to the selected region is measured. The remaining region M1.2 (dotted)—and thus a remaining percentage of 1−p1 of the magnetic resonance data of k-space corresponding to the selected region—is subsequently supplemented in a supplementation unit of the control device of the magnetic resonance apparatus by means of a known supplementation method. A (supplemented) complete first set of magnetic resonance data thus exists.

In a second measurement M2, the partial region T (which is to measured twice, for example) of k-space corresponding to the selected region is measured, which here thus corresponds to the region M2.1 to be measured in the second measurement. Additional magnetic resonance data from the dotted region M2.2 of k-space that is to be measured, which region M2.2 is not covered by the partial region T, can again subsequently be supplemented in a supplementation unit of the control device of the magnetic resonance apparatus by means of a known supplementation method. An additional (supplemented) complete set of magnetic resonance data of k-space exists in which a percentage p2 of k-space, which percentage p2 corresponds to the partial region T, has been measured and the remaining percentage 1−p2 is supplemented. However, it is also possible to not supplement the unmeasured magnetic resonance data from the region M2.2 in the second measurement M2, and to process the magnetic resonance data acquired from the partial region T into a data set later with the first set of magnetic resonance data obtained from the first measurement M1.

So that the partial region T is actually measured multiple times, the second percentage p2 of k-space—which percentage p2 is covered by the partial region T—is in particular chosen to be smaller than or equal to the first percentage p1.

The selection of the first percentage p1 preferably lies between 50% and 100%. This means that the entirety of k-space can also be measured in the first measurement M1. In one exemplary embodiment, the first percentage p1 comprises half of k-space, plus a single-digit number of additional k-space lines to be acquired. In the second measurement M2, magnetic resonance data of the "missing" region M2.2 can be supplemented, with which two complete sets of magnetic resonance data of k-space can be processed into a data set.

If the entirety of k-space in is measured in the first measurement M1, and no magnetic resonance data are supplemented in the second measurement M2, a case then exists according to one of the examples without supplementation methods.

If magnetic resonance data are supplemented in both the first measurement M1 and the second measurement M2, two complete sets of magnetic resonance data from k-space corresponding to the selected region likewise exist. If at least 50 percent of k-space is respectively measured in the first measurement M1 and the second measurement M2 and the remaining magnetic resonance data are supplemented, the unwanted artifacts can be entirely avoided. Given lower percentages of measured magnetic resonance data per measurement and/or given an incomplete supplementation, the unwanted artifacts can at least be strongly reduced.

In the example of FIG. 7, the partial region T is arranged at the left edge of k-space, analogous to FIG. 4. However, the variants of the arrangement of partial region T that are shown in FIGS. 5 and 6 are also conceivable and analogously result, wherein regions M1.2 and M2.2 (that are possibly to be supplemented with magnetic resonance data) are ideally arranged in an edge region of k-space corresponding to the selected region in order to ensure a frictionless workflow of the supplementation method.

Figure 8:
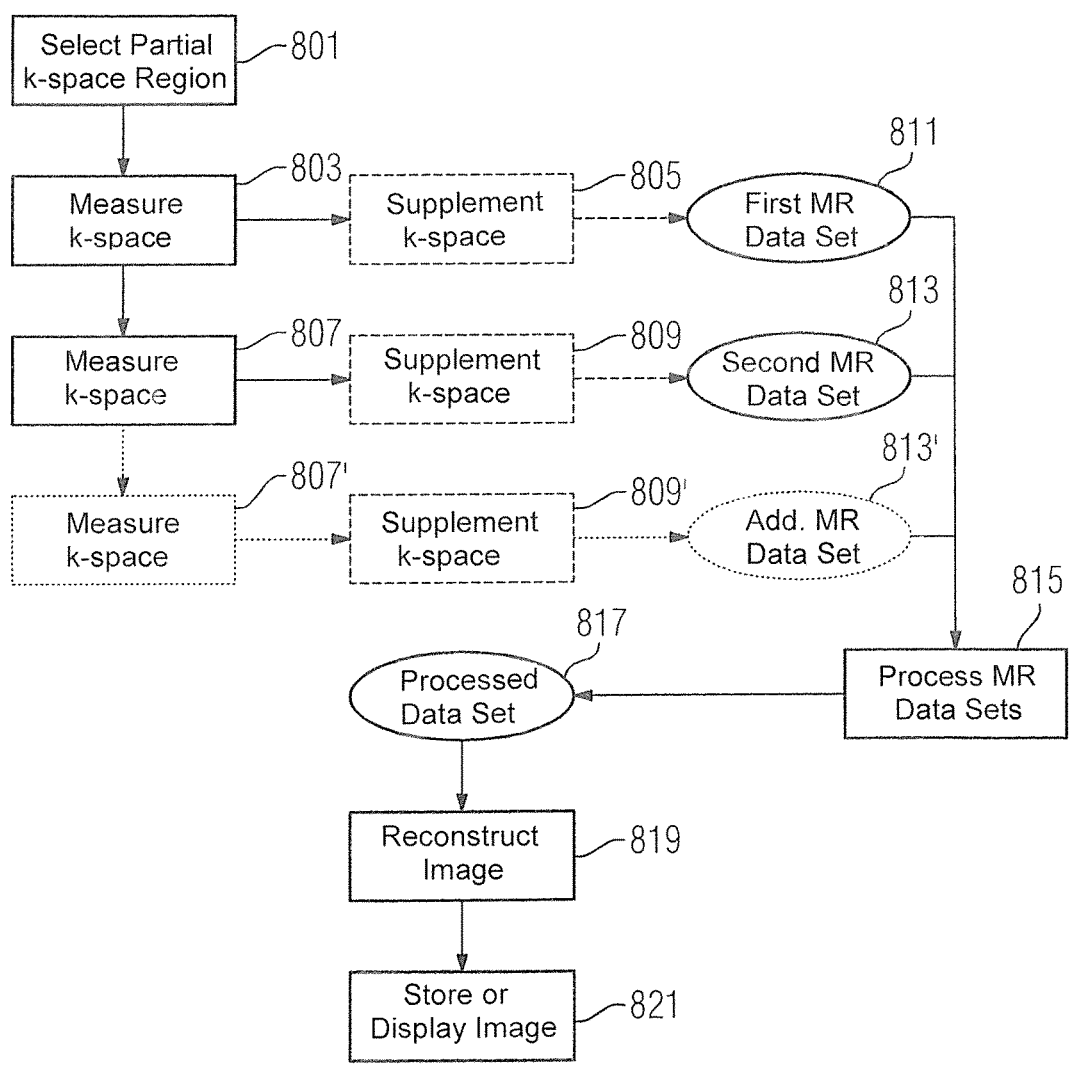
FIG. 8 is a flowchart for an exemplary embodiment of method according to the invention.

FIG. 8 is a flowchart of a method according to the invention.

A partial region of k-space corresponding to the selected region is initially selected in which magnetic resonance data should be acquired multiple times (Block 801) by means of a pulse sequence that is executed by the magnetic resonance system. This selection of the region of k-space can take place manually or can take place automatically according to preset values, for example 60% of k-space from the left edge of k-space.

K-space is then measured at least in part in a first measurement (Block 803). Magnetic resonance data (of k-space that corresponds to the selected region) that are missing in this first measurement 803 can possibly be supplemented by means of a known supplementation method (Block 805), as was described above in relation to FIG. 7. The magnetic resonance data that were acquired within the scope of the first measurement 803 (and possibly 805) form a first set of magnetic resonance data 811.

In a further measurement, k-space is measured again, in such a manner that magnetic resonance data are measured an additional time from the selected partial region of k-space (Block 807). Magnetic resonance data that are not acquired in this measurement can possibly again by supplemented by means of a known supplementation method (Block 809) as it was described above with regard to FIG. 7. The magnetic resonance data that are acquired within the scope of this additional measurement 807 (and possibly 809) form an additional set of magnetic resonance data 813.

The region of k-space from which magnetic resonance data were acquired in the first measurement 803 differs from the partial region of k-space from which magnetic resonance data are acquired in the further measurement 807. For example, the entirety of k-space is acquired in the first measurement 803, and only a partial region (which is smaller than the entirety of k-space) is measured in the additional measurement.

In the event that it is desired or required due to the desired arrangement of the partial region (see FIGS. 4 through 6), additional measurements 807'—possibly taking place with additional supplementation of magnetic resonance data 809'—can analogously be implemented that deliver an additional set of magnetic resonance data 813'. This can be the case if the partial region should be measured more than twice, for example in order to increase the signal-to-noise ratio (SNR).

The magnetic resonance data 811, 813 (and possibly 813') that are obtained in such a manner are processed into a data set 817 (Block 815). In particular, none of the aforementioned supplementation methods is hereby necessary; rather, the magnetic resonance data 811 and 813 (and possibly 813') can simply be added together, for example, in order to obtain the data set 817.

For example, image data can be reconstructed (Block 819) from the data set 817, which image data can be displayed at a terminal of the magnetic resonance system and/or be stored in a control device of said magnetic resonance system (Block 821).

Although modifications and changes may be suggested by those skilled in the art, it is the intention of the inventor to embody within the patent warranted hereon all changes and modifications as reasonably and properly come within the scope of his contribution to the art.

I claim as my invention:

1. A method for acquiring magnetic resonance data, comprising:
   operating a magnetic resonance data acquisition unit to acquire magnetic resonance data from an examination subject in the magnetic resonance data acquisition unit, that include magnetic resonance data from a selected region of the examination subject;
   via a processor supplied with said magnetic resonance data, entering said magnetic resonance data into an electronic memory representing k-space, and thereby producing a portion of k-space filled with magnetic resonance data acquired from said selected region of the examination subject;
   via said processor, selecting a partial region of k-space within said portion of k-space filled with data acquired from said selected region of the subject, with said selected region being decentrally located in k-space so as to be asymmetrical with respect to a center of k-space;
   acquiring said magnetic resonance data from said partial region in k-space more than once, thereby obtaining multiply acquired magnetic resonance data; and
   making said multiply acquired magnetic resonance data available at an output of said processor in electronic form as a data file.

2. A method as claimed in claim 1 comprising selecting said partial region so as to include said center of k-space.

3. A method as claimed in claim 1 wherein k-space has a plurality of edges, and selecting said partial region so as to be adjacent at least one of said edges.

4. A method as claimed in claim 1 comprising selecting said partial region by shifting said partial region out of a central position in said portion of k-space filled with data acquired from the selected region of the subject, in a direction in which said partial region is smaller than an entirety of said portion, and in a direction toward an edge of said portion of k-space.

5. A method as claimed in claim 1 comprising selecting said partial region to be at least 40% of said portion of k-space filled with magnetic resonance data acquired from said selected region of the subject.

6. A method as claimed in claim 1 comprising supplementing any unmeasured magnetic resonance data from said portion of k-space using a magnetic resonance data supplementation technique.

7. A method as claimed in claim 6 comprising measuring a first percentage of said portion of k-space in a first measurement and supplementing a remaining percentage of said portion of k-space using said magnetic resonance supplementation technique.

8. A method as claimed in claim 6 comprising measuring said partial region in a second measurement and supplementing magnetic resonance data from k-space not encompassed by said partial region using said magnetic resonance supplementation technique.

9. A method as claimed in claim 6 comprising, in a first measurement, measuring a first percentage of more than 50% of said portion of k-space and supplementing a remaining percentage of said portion of k-space using said magnetic resonance supplementation technique and, in a second measurement, measuring said partial region and supplementing magnetic resonance data from k-space not encompassed by said partial region using said magnetic resonance supplementation technique, with said partial region being less than or equal to said first percentage of said portion of k-space.

10. A method as claimed in claim 1 comprising operating said magnetic resonance data acquisition unit to acquire said magnetic resonance data by executing a three-dimensional turbo spin echo sequence.

11. A method as claimed in claim 1 comprising operating said magnetic resonance data acquisition unit to acquire said magnetic resonance data by executing a SPACE sequence.

12. A magnetic resonance apparatus comprising:
a magnetic resonance data acquisition unit;
a control unit configured to operate a magnetic resonance data acquisition unit to acquire magnetic resonance data from an examination subject in the magnetic resonance data acquisition unit, that include magnetic resonance data from a selected region of the examination subject;
a processor supplied with said magnetic resonance data, said processor being configured to enter said magnetic resonance data into an electronic memory representing k-space, to thereby produce a portion of k-space filled with magnetic resonance data acquired from said selected region of the examination subject;
said processor being configured to receive a manual input that selects, or to automatically select a partial region of k-space within said portion of k-space filled with data acquired from said selected region of the subject, with said selected region being decentrally located in k-space so as to be asymmetrical with respect to a center of k-space;
said processor being configured to acquire said magnetic resonance data from said partial region in k-space more than once, thereby obtaining multiply acquired magnetic resonance data; and
said processor being configured to make said multiply acquired magnetic resonance data available at an output of said processor in electronic form as a data file.

13. A non-transitory, computer-readable data storage medium encoded with programming instructions, said data storage medium being loaded into a computerized control and evaluation system of a magnetic resonance apparatus that also comprises a magnetic resonance data acquisition unit, said programming instructions causing said control and evaluation system to:
operate the magnetic resonance data acquisition unit to acquire magnetic resonance data from an examination subject in the magnetic resonance data acquisition unit, that include magnetic resonance data from a selected region of the examination subject;
enter said magnetic resonance data into an electronic memory representing k-space, to thereby produce a portion of k-space filled with magnetic resonance data acquired from said selected region of the examination subject;
automatically implement, or allow a manual selection of, a partial region of k-space within said portion of k-space filled with data acquired from said selected region of the subject, with said selected region being decentrally located in k-space so as to be asymmetrical with respect to a center of k-space;
acquire said magnetic resonance data from said partial region in k-space more than once, thereby obtaining multiply acquired magnetic resonance data; and
make said multiply acquired magnetic resonance data available at an output of said controlled evaluation system in electronic form as a data file.

* * * * *